United States Patent
Moeny et al.

(10) Patent No.: US 10,113,364 B2
(45) Date of Patent: Oct. 30, 2018

(54) METHOD AND APPARATUS FOR ISOLATING AND SWITCHING LOWER VOLTAGE PULSES FROM HIGH VOLTAGE PULSES IN ELECTROCRUSHING AND ELECTROHYDRAULIC DRILLS

(71) Applicant: SDG LLC, Albuquerque, NM (US)

(72) Inventors: William M. Moeny, Bernalillo, NM (US); Josh Gilbrech, Albuquerque, NM (US); Richard Adler, Marana, AZ (US)

(73) Assignee: SDG LLC, Minden, NV (US)

( * ) Notice: Subject to any disclaimer, the term of this patent is extended or adjusted under 35 U.S.C. 154(b) by 842 days.

(21) Appl. No.: 14/494,461

(22) Filed: Sep. 23, 2014

(65) Prior Publication Data
US 2015/0083491 A1    Mar. 26, 2015

Related U.S. Application Data

(60) Provisional application No. 61/881,127, filed on Sep. 23, 2013, provisional application No. 61/900,695,
(Continued)

(51) Int. Cl.
*E21B 7/15* (2006.01)
*E21B 4/04* (2006.01)
(Continued)

(52) U.S. Cl.
CPC .......... *E21B 7/15* (2013.01); *E21B 4/04* (2013.01); *H01F 38/08* (2013.01); *H03H 7/38* (2013.01);
(Continued)

(58) Field of Classification Search
CPC ... E21B 4/04; E21B 7/15; H01F 38/08; H01F 2017/062
See application file for complete search history.

(56) References Cited

U.S. PATENT DOCUMENTS 2,623,921 A   12/1952   Smits
2,818,020 A   12/1957   Bruklund
(Continued)

FOREIGN PATENT DOCUMENTS

CA   2262581   1/2006
CA   2581701   10/2013
(Continued)

OTHER PUBLICATIONS

"Diekektrol-II Fluid", GE Company Material Safety Data Sheet, Mar. 25, 1996.
(Continued)

*Primary Examiner* — David J Bagnell
*Assistant Examiner* — Tara E Schimpf
(74) *Attorney, Agent, or Firm* — Peacock Law P.C.; Philip Askenazy; Deborah Peacock

(57) ABSTRACT

Method and apparatus for isolating and switching lower voltage pulses from high voltage pulses in electrocrushing and electrohydraulic drills. A transformer with a high permeability core acts as a magnetic switch or saturating inductor to switch high voltage pulses to initiate an electrocrushing arc and lower voltage pulses to sustain the arc. The transformer isolates the lower voltage components from the high voltage pulses, and switches to deliver the low voltage current when the core saturates. The transformer enables impedance matching to the arc during all stages of drilling. The saturation time of the transformer core is the time delay between initiation of delivering the high voltage pulse and initiation of delivering the lower voltage current.

15 Claims, 3 Drawing Sheets

Related U.S. Application Data filed on Nov. 6, 2013, provisional application No. 61/904,268, filed on Nov. 14, 2013.

(51) Int. Cl.
  *H01F 38/08* (2006.01)
  *H03H 7/38* (2006.01)

(52) U.S. Cl.
  CPC .......... *Y10T 307/74* (2015.04); *Y10T 307/747* (2015.04)

(56) References Cited

U.S. PATENT DOCUMENTS

| | | | |
|---|---|---|---|
| 2,821,637 A | 1/1958 | Roberts et al. | |
| 2,822,148 A | 2/1958 | Murray | |
| 2,953,353 A | 9/1960 | Allen | |
| 3,076,513 A | 2/1963 | Heaphy | |
| 3,158,207 A | 11/1964 | Rowley | |
| 3,173,787 A | 3/1965 | Clement et al. | |
| 3,179,187 A | 4/1965 | Sarapuu | |
| 3,183,390 A | 5/1965 | Grader et al. | |
| 3,468,387 A | 9/1969 | Benson | |
| 3,500,942 A | 3/1970 | Smith | |
| 3,506,076 A | 4/1970 | Angona | |
| 3,510,676 A * | 5/1970 | Pierce, Jr. | H03K 3/352 219/130.51 |
| 3,539,406 A | 11/1970 | Lissant | |
| 3,621,916 A | 11/1971 | Smith, Jr. | |
| 3,679,007 A | 7/1972 | O'Hare | |
| 3,680,431 A | 8/1972 | Papp | |
| 3,700,169 A | 10/1972 | Naydan et al. | |
| 3,708,022 A | 1/1973 | Woodruff | |
| 3,715,082 A | 2/1973 | Carley-Macauly et al. | |
| 3,796,463 A | 3/1974 | Naydan et al. | |
| 3,829,816 A | 8/1974 | Barry et al. | |
| 3,840,078 A | 10/1974 | Allgood et al. | |
| 3,881,559 A | 5/1975 | Allgood et al. | |
| 3,957,118 A | 5/1976 | Barry et al. | |
| 3,974,116 A | 8/1976 | Lissant | |
| 4,040,000 A | 8/1977 | Dwivedi | |
| 4,122,387 A | 10/1978 | Ajam et al. | |
| 4,169,503 A | 10/1979 | Scott et al. | |
| 4,328,458 A * | 5/1982 | Hiromitsu | H01F 29/14 307/17 |
| 4,335,465 A | 6/1982 | Christiansen et al. | |
| 4,345,650 A | 8/1982 | Wesley | |
| 4,412,967 A | 11/1983 | Winterberg et al. | |
| 4,479,680 A | 10/1984 | Wesley et al. | |
| 4,523,194 A | 6/1985 | Hyde | |
| 4,525,287 A | 6/1985 | Carstensen | |
| 4,540,127 A | 9/1985 | Andres | |
| 4,740,319 A | 4/1988 | Patel et al. | |
| 4,741,405 A | 5/1988 | Moeny et al. | |
| 4,899,834 A | 2/1990 | Weldon | |
| 4,937,832 A | 6/1990 | Rocca | |
| 4,975,917 A | 12/1990 | Villa | |
| 5,004,050 A | 4/1991 | Sizonenko et al. | |
| 5,019,119 A | 5/1991 | Hare, Sr. | |
| 5,027,264 A * | 6/1991 | DeDoncker | H02M 3/33584 363/129 |
| 5,088,568 A | 2/1992 | Simuni | |
| 5,091,819 A | 2/1992 | Christiansen et al. | |
| 5,106,164 A | 4/1992 | Kitzinger et al. | |
| 5,126,638 A | 6/1992 | Dethlefsen | |
| 5,146,141 A | 9/1992 | Rohde | |
| 5,179,541 A | 1/1993 | Weido | |
| 5,228,011 A | 7/1993 | Owen | |
| 5,272,022 A | 12/1993 | Takami et al. | |
| 5,336,647 A | 8/1994 | Nae et al. | |
| 5,386,877 A | 2/1995 | Codina et al. | |
| 5,394,411 A | 2/1995 | Milchberg et al. | |
| 5,398,217 A | 3/1995 | Cannelli et al. | |
| 5,399,941 A | 3/1995 | Grothaus et al. | |
| 5,425,570 A | 6/1995 | Wilkinson | |
| 5,432,756 A | 7/1995 | Bryden | |
| 5,502,356 A | 3/1996 | McGeoch | |
| 5,556,832 A | 9/1996 | Van Slyke | |
| 5,568,448 A | 10/1996 | Tanigushi et al. | |
| 5,573,307 A | 11/1996 | Wilkinson et al. | |
| 5,586,608 A | 12/1996 | Clark et al. | |
| 5,646,561 A | 7/1997 | Fanini et al. | |
| 5,658,860 A | 8/1997 | Clark et al. | |
| 5,685,377 A | 11/1997 | Arstein et al. | |
| 5,864,064 A | 1/1999 | Kano et al. | |
| 5,896,938 A | 4/1999 | Moeny et al. | |
| 5,967,816 A | 10/1999 | Sampa et al. | |
| 6,026,099 A | 2/2000 | Young | |
| 6,104,022 A | 8/2000 | Young et al. | |
| 6,116,357 A | 9/2000 | Wagoner et al. | |
| 6,123,561 A | 9/2000 | Turner et al. | |
| 6,145,934 A | 11/2000 | Arai et al. | |
| 6,164,388 A | 12/2000 | Martunovich et al. | |
| 6,173,787 B1 | 1/2001 | Wittrisch | |
| 6,215,734 B1 | 4/2001 | Moeny et al. | |
| 6,280,519 B1 | 8/2001 | Yezrielev et al. | |
| 6,280,659 B1 | 8/2001 | Sundin | |
| 6,457,778 B1 | 10/2002 | Chung et al. | |
| 6,510,899 B1 | 1/2003 | Sheiretov et al. | |
| 6,608,005 B2 | 8/2003 | Palmer et al. | |
| 6,620,769 B1 | 9/2003 | Juppe et al. | |
| 6,658,968 B2 | 12/2003 | Linden et al. | |
| 6,666,274 B2 | 12/2003 | Hughes | |
| 6,719,068 B2 | 4/2004 | Jonsson | |
| 6,761,416 B2 | 7/2004 | Moeny et al. | |
| 6,770,603 B1 | 8/2004 | Sawdon et al. | |
| 6,787,505 B1 | 9/2004 | Maitland et al. | |
| 6,909,667 B2 | 6/2005 | Shah et al. | |
| 6,935,702 B2 | 8/2005 | Okazaki et al. | |
| 7,156,676 B2 | 1/2007 | Reynolds, Jr. | |
| 7,247,604 B2 | 7/2007 | Dalmazzone et al. | |
| 7,270,195 B2 | 9/2007 | MacGregor et al. | |
| 7,384,009 B2 | 6/2008 | Moeny | |
| 7,416,032 B2 | 8/2008 | Moeny et al. | |
| 7,527,108 B2 | 5/2009 | Moeny | |
| 7,530,406 B2 | 5/2009 | Moeny et al. | |
| 7,559,378 B2 | 7/2009 | Moeny | |
| 7,784,563 B2 | 8/2010 | Rodland et al. | |
| 7,959,094 B2 | 6/2011 | Moeny | |
| 8,083,008 B2 | 12/2011 | Moeny | |
| 8,109,345 B2 | 2/2012 | Jeffryes | |
| 8,172,006 B2 | 5/2012 | Moeny | |
| 8,186,454 B2 * | 5/2012 | Moeny | E21B 7/15 175/16 |
| 8,567,522 B2 | 10/2013 | Moeny | |
| 8,616,302 B2 | 12/2013 | Moeny | |
| 8,789,772 B2 | 7/2014 | Moeny | |
| 8,922,048 B2 | 12/2014 | Giesler | |
| 9,010,458 B2 | 4/2015 | Moeny | |
| 9,016,359 B2 | 4/2015 | Moeny | |
| 9,190,190 B1 | 11/2015 | Moeny | |
| 2002/0002933 A1 | 1/2002 | Yezrielev et al. | |
| 2002/0005346 A1 | 1/2002 | Babington | |
| 2003/0069110 A1 | 4/2003 | Chang | |
| 2004/0106523 A1 | 6/2004 | Stridde et al. | |
| 2005/0029476 A1 | 2/2005 | Biester et al. | |
| 2005/0150688 A1 | 7/2005 | MacGregor et al. | |
| 2006/0037516 A1 | 2/2006 | Moeny | |
| 2006/0037779 A1 | 2/2006 | Moeny | |
| 2006/0038045 A1 | 2/2006 | Moeny | |
| 2006/0038437 A1 | 2/2006 | Moeny | |
| 2006/0137909 A1 | 6/2006 | Moeny | |
| 2006/0151211 A1 * | 7/2006 | Coenen | E21B 4/04 175/19 |
| 2006/0209582 A1 * | 9/2006 | Tsuruya | H01F 38/08 363/125 |
| 2006/0243486 A1 | 12/2006 | Moeny | |
| 2007/0137893 A1 | 6/2007 | Moeny et al. | |
| 2007/0152494 A1 | 7/2007 | Moeny | |
| 2007/0167051 A1 | 7/2007 | Reynolds, Jr. | |
| 2008/0277508 A1 | 11/2008 | Moeny | |
| 2009/0050371 A1 | 2/2009 | Moeny | |
| 2009/0105955 A1 | 4/2009 | Castillo et al. | |
| 2009/0120689 A1 | 5/2009 | Zaeper et al. | |

(56) References Cited

U.S. PATENT DOCUMENTS

| | | |
|---|---|---|
| 2009/0133929 A1 | 5/2009 | Rodland |
| 2010/0000790 A1 | 1/2010 | Moeny |
| 2010/0300756 A1 | 12/2010 | Bergstrom et al. |
| 2011/0036560 A1 | 2/2011 | Vail, III et al. |
| 2011/0278382 A1 | 11/2011 | Moeny |
| 2012/0024600 A1 | 2/2012 | Bittar et al. |
| 2012/0043075 A1 | 2/2012 | Abramova et al. |
| 2012/0103693 A1 | 5/2012 | Jeffryes |
| 2012/0132466 A1 | 5/2012 | Moeny |
| 2012/0168177 A1 | 7/2012 | Moeny |
| 2012/0217064 A1 | 8/2012 | Moeny |
| 2012/0256634 A1 | 10/2012 | Morys |
| 2013/0112482 A1 | 5/2013 | Armistead et al. |
| 2013/0140086 A1 | 6/2013 | Moeny |
| 2014/0008968 A1 | 1/2014 | Moeny |
| 2014/0367502 A1 | 12/2014 | Moeny |
| 2015/0308235 A1 | 10/2015 | Moeny et al. |
| 2016/0017663 A1 | 1/2016 | Moeny |
| 2017/0204668 A1 | 7/2017 | Lehr |

FOREIGN PATENT DOCUMENTS

| | | |
|---|---|---|
| CA | 2658570 | 3/2015 |
| CA | 2661026 | 2/2016 |
| DE | 3150430 | 7/1983 |
| DE | 3942307 | 7/1991 |
| EP | 0453076 | 10/1991 |
| EP | 0921270 | 6/1999 |
| FR | 2574559 | 6/1986 |
| RU | 2150326 | 6/2000 |
| WO | 92/11546 | 7/1992 |
| WO | 94/03949 | 2/1994 |
| WO | WO9703796 | 2/1997 |
| WO | 98/07960 | 2/1998 |
| WO | WO9806234 | 2/1998 |
| WO | 99/14286 | 3/1999 |
| WO | 02/078441 | 10/2002 |
| WO | WO2003/069110 | 8/2003 |
| WO | 2005/054620 | 6/2005 |
| WO | 2006/023998 | 3/2006 |
| WO | 2007/024263 | 3/2007 |
| WO | 2008/003092 | 1/2008 |
| WO | 2008/097101 | 8/2008 |
| WO | WO10/027866 | 3/2010 |
| WO | WO12/094676 | 7/2012 |
| WO | WO12/173969 | 12/2012 |
| WO | 2014/008483 | 1/2014 |
| WO | 2014/100255 | 6/2014 |
| WO | 2015/042608 | 3/2015 |

OTHER PUBLICATIONS

"Dielectric Electrical Properties Polyglycols", ChemPoint.com.
"Dielektrol-I Fluid", GE Company Material Safety Data Sheet, Mar. 25, 1996.
"Dielektrol-III Fluid", GE Company Material Safety Data Sheet, Mar. 25, 1996.
"Dielektrol-IV Fluid", GE Company Material Safety Data Sheet, May 23, 1996.
"Dielektrol-V Fluid", GE Company Material Safety Data Sheet, Mar. 25, 1996.
"Dielektrol-VI Fluid", GE Company Material Safety Data Sheet, Dec. 7, 1999.
"Dielektrol-VII Fluid", GE Company Material Safety Data Sheet, Nov. 2, 1999.
"Drilling Research on the Electrical Detonation and Subsequent Cavitation in a Liquid Technique (Spark Drilling)", SAND75-0417, Jul. 1975, 1-47.
"Drilling Research on the Electrical Detonation and Subsequent Cavitation in a Liquid Technique (Spark Drilling)", Drilling Research Division Sandia Laboratories, Jul. 1975, 1-57.
"Geconol", GE Company Material Safety Data Sheet, Mar. 25, 1996.
"ICOA Technical Bulletins", www.icoa.org, May 2004.
"Plasma blasting in the Canadian Mining Industry", Energy, Mines and Resources, Energy Diversification Research Laboratory, Cadet Newsletter No. 4, Dec. 1990, 1-4.
"Polycin TC", Caschem, Apr. 2004.
Akhmetov, et al., "The effect of a hydroelectric discharge on the capacitance and filtration properties of rocks", Izv. Akad. Nauk Az. SSR, Ser. Nauk Zemie, 1983, 128-131.
Andres, "Electrical Disintegration of Rock", Mineral Processing and Extractive Metallurgy Review, 1995, vol. 14, 1995, 87-110.
Andres, et al., "Liberation of Mineral Constituents by High-Voltage Pulses", Powder Technology, 48, 1986, 269-277.
Andres, et al., "Liberation of minerals by high-voltage electrical pulses", Powder Technology 104, Dec. 29, 1998, 37-49.
Andres, "Liberation Study of Apatite Nepheline Ore Comminuted by Penetrating Electrical Discharges", International Journal of Mineral Processing, 4, 1977, 33-38.
Andres, "Parameters of disintegration of rock by electrical pulses", Powder Technol v. 58, n 4 Aug. 1989, 1989, 265-269.
Andres, "Parameters of Disintegration of Rock by Electrical Pulses", Powder Technology, 58, 1989, 265-269.
Aso, et al., "Temporary Ventilation Shaft Structure of Abo Tunnel on Chubu Thruway, Ewquipment Taking into Consideration Cold District and Winter Storage", Kensetsu No Kikaika, No. 555, May 25, 1996, 32-38.
Bindeman, "Fragmentation phenomena in populations of magmatic crystals", American Mineralogist, vol. 90, 2005, 1801-1815.
Bluhm, et al., "Application of Pulsed HV Discharges to Material Fragmentation and Recycling", IEEE Transactions on Dielectrics and Electrical Insulation, vol. 7, No. 5, Oct. 2000, 625-636.
Bommakanti, et al., "Design of a Travelling Wave Tube Feedthrough—Insulator Material Considerations", University of South Carolina, Unknown, 200-204.
Brady, et al., "Pulsed Plasma Thruster Ignitor Plug Ignition Characteristics", Presented as a paper at the AIAA/ASME Third Joint Thermophysics Conference, St. Louis, MO, Jun. 1982.
Broyer, et al., "New discharge circuit using high voltage transmission line for efficient shock wave generation; application to lithotripsy", IEEE Ultrasonics Symposium v 3, 1994.
Budenstein, "On the Mechanism of Dielectric Breakdown of Solids", IEEE Transactions on Electrical Insulation vol. EI-15, No. 3, Jun. 1980, 225-240.
Chaturvedi, et al., "Modeling of shock-wave generation in water by electrical discharges", IEEE Trans Plasma Sci, vol. 28, No. 5, Oct. 2000, 1552-1557.
Chernyak, "Dielectric Constant, Dipole Moment, and Solubility Parameters of some Cyclic Acid Esters", J. Chem, Eng. Data 2006, 2006, 416-418.
Cook, et al., "Rock Fragmentation by Mechanical, Chemical and Thermal Methods", VI International Mining Congress, 1970, 1-5.
Dean, "Lange's Handbook of Chemistry", 15th edition,, 1999, section 5,112.
Dubovenko, et al., "Underwater electrical discharge characteristics at high values of initial pressure and temperature", IEEE International Conference on Plasma Science 1998, 1998.
Filatov, et al., "Nanosecond-Discharge-Assisted Selective Separation of Fine Inclusions not Involved in the Impurity Lattice", IEEE, 1997, 1103-1105.
Filatov, et al., "Nanosecond-Discharge-Assisted Selective Separation of Fine inclusions not Involved in the Impurity Lattice", IEEE, 1997, 1-3.
Furujo, "Current Trends of Plasma Cutting Technology", Yosetsu Gakkai-Shi (Journal of the Japan Welding Society), Vo. 66, No. 7, Oct. 5, 1997, 33-37.
Goldfarb, et al., "Removal of Surface Layer of Concrete by a Pulse-Periodical Discharge", IEEE, 1977, 1078-1084.
Goldfarb, et al., "Removal of Surface Layer of Concrete by a Pulse-Periodical Discharge", IEEE, 1997, 1-7.
Goldstein, "Electric Cartridge Guns Using Fluids Heated by a Capillary Plasma Jet—An Extension of Classical Gun Technology to High Velocities", Abstract—GT-Devices Inc., Alexandria, VA, Sep. 1983.

(56) References Cited

OTHER PUBLICATIONS

Hamelin, et al., "Hard Rock Fragmentation with Pulsed Power", 1993 Pulsed Power Conference, 1993, 11-14.
Hasebe, et al., "Focusing of Shock Wave by Underwater Discharge, On Nonlinear Reflection and Focusing Effect", Zairyo (Journal of the Society of Materials Science, Japan), vol. 45., No. 10, Oct. 15, 1996, 1151-1156.
Hawrylewicz, "Cutting and Fragmentation of Hard Rocks by Electrohydraulic Discharge: An Experiemental Study", Intel Symposium on Jet Cutting Technology, 1984, 583-588.
Hawrylewicz, et al., "Experiment with electric discharge in rock splitting", Symposium on Rock Mechanics, vol. 27, Jun. 1986, 429-435.
Hawrylewicz, et al., "Experiment with Electric Discharge in Rock Splitting", Symposium on Rock Mechanics 27th. Publ by Soc of Mining Engineers of AIME, 1986.
Hawrylewicz, et al., "Experiment with Electric Discharge in Rock Splitting", Society of Mining Engineers of AIME conference 1986, 429-435.
Hogeland, et al., "Aluminum-Enhanced Underwter Electrical Discharges for Steam Explosion Triggering", Sandia National Labs., Jul. 1999.
Huang, et al., "Separation and preconcentration combined with glow discharge atomic emission spectrometry for the determination of rate earth elements (a, Nd<Eu, Dy, Y) in geological samples", Fresenius' Journal of Analytical Chemistry, 2000.
Huismann, et al., "Arc Voltage Measurements of the Hyperbaric MIG Process", 14, International Conference on Offshore Mechanics Arctic Engineering (OMAE), Jun. 1996.
Inoue, et al., "Drilling of Hard Rocks by Pulsed Power", 2000IEEE, vol. 16, No. 3, Jun. 2000, 19-25.
Inoue, et al., "Pulsed Electric Breakdown and Destruction of Granite", Jp. J. Appl. Phys. vol. 38, Nov. 1, 1999, 6502-6505.
Ivanov, et al., "Discharge-pulse technology of development of sulphidic ores at the bottom of ocean. The Part II. (Problems if electrodischarge-chemical explosions)", Elektronnaya Obrabotka Materialov, No. 1, 2002, 57-63.
Kalyatskij, et al., "Optimization of wear of electrode systems under rock crushing by discharge-producing electrical pulses", Elektron Obr Mater n 01 Jan.-Feb. 1991, 1991, 43-45.
Kil'Keyev, et al., "Aspects of absorption of microwave energy by frozen rock", 5. Competition of Young Scientists and Specialists at the Faculty of Gas and Oil, Geology and Geophysics Meeting, May 1, 1981, 20-21.
Komatsubara, "Recent trend of new flue gas treating technology", R and D News Kansai, 1993, 33-35.
Kudo, et al., "Application of the Electric Discharge Logging System", Proceeding of the 97th (Fall, Fiscal 1997) SEGJ Conference, 1997, 326-330.
Kudo, et al., "Features of the Electric Discharge Logging System", Proceeding of the 97th (Fall, Fiscal 1997) SEGJ Conference, 1997, 321-325.
Kumazaki, et al., "Production of Artificial Fulgurite by Utilizing Rocket Triggered Lightning", Denki Gakkai Ronbunshi, A (Transactions of the Institute of Electrical Engineers of Japan, Fundamentals and Materials), vol. 117, No. 10, 1997, 1013-1020.
Kurihara, et al., "Inventigation of Phenomena of Sourthern Hyogo Earthquake, and Observation of Thunderbolts in Winter Using the Integrated Thunderbolt Observation System", Denryoku Chuo Kenkyusho Kenkyu Nenpo, 1996, 50-53.
Lisitsyn, et al., "Breakdown and Destruction of Heterogeneous Solid Dielectrics by High Voltage Pulses", Journal of Applied Physics, vol. 84, No. 11, 1998, 6262-6267.
Lisitsyn, et al., "Drilling and Demolition of Rocks by Pulsed Power", IEEE, 1999, 169-172.
Lisitsyn, et al., "Role of electron clusters—Ectons—in the breakdown of solid dielectrics", Physics of Plasma, vol. 5, No. 12, 1998, 4484-4487.

Malyushevskij, et al., "Discharge-pulse technology of mining of sulfidic ores at the bottom of ocean. Part I. (The problem of deep-water electric explosion)", Elektronnaya Obrabotka Materialov No. 6, 2001, 41-49.
Malyushevskij, et al., "Discharge-pulse technology of mining of sulphide ores on the bottom of the Ocean. The Part III (Ecological electrodischarge-chemical explosions)", Elektronnaya Obrabotka Meterialov, No. 2, 2002, 45-57.
Matsumoto, "Acceleration Methods of Itonic Clusters", Proceedings of the 25th Linear Accelerator Meeting in Japan, 2000, 77-79.
Matsumoto, "Feasibility of X-ray Laser by Underwater Spark Discharges", Proceedings of the First Symposium on Advanced Photon Research, 1999, 149-152.
Maurer, "Advanced Drilling Techniques", Petroleum Publishing Co., 139-146.
Maurer, "Spark Drilling", Rock Mechanics—Theory and Practice, Chapter 33, 1969, 687-703.
Maurer, "Spark Drills", Advanced Drilling Techniques, Chapter 21, Petroleum Publishing Co., 1980, 508-541.
McClung, "The feasibility of developing a borehole sparker for geothermal wells", EG and G Energy Measurements, Inc., 1997.
Mozumi, et al., "Tunnel blasting with non-electric detonators in the Kamioka mine", Kogyo Kayaku (Japan, vol. 54, No. 1, Feb. 25, 1993, 44-49.
No Author, "Proceedings of the 23rd International Conference of Safety in Mines Research Institutes; Abstracts", International Conference of Safety in Mines Research Institutes, 1989.
No Author, "Proceedings of the eighteenth annual conference on explosives and blasting technique", International Society of Explosives Engineers, 1992.
Park, et al., "Recent Results on Development of a Table-Top Soft X-Ray Laser", Applied Physics B, vol. 58, No. 1, 1994, 19-55.
Pierce, et al., "Advanced Drilling Systems Study", Sand95-0331, 1996, 1-IX-26.
Ploeger, et al., "Optimisation of the core shroud bypass flow in the nuclear power plant Unterweser, Part 2: Hardware Implementation", 9, International Conference on Nuclear Engineering, Nice Acropolis (France), 2001.
Pronko, et al., "Megajoule Pulsed Power Experiments for Plasma Blasting Mining Applications", 1993 Pulsed Power Conference, 1993, 15-18.
Puharic, et al., "Overvoltage Analysis on Submarine Cables of Atmospheric Origins and Due to Switching Operations", CIRED: 14th International Conference and Exhibition on Electricity Distribution. Proceedings. Part. 1: Contrubutions, 1997, 2.44.1-2.44.5.
Res, et al., "Disintegration of hard rocks by the electrohydrodynamic method", Mining Engineering, 1987, 44-47.
Rocca, et al., "Demonstration of Discharge Pumped Table-Top Soft-X-Ray Laser", Physical Review Letters, vol. 73, No. 16, 1994, 2192-2195.
Rocca, et al., "Discharge-Driven 46.9-nm Amplifier with Gain-Length Approaching Saturation", IEEE Journal—Topics in Quantum Electronics, vol. 1, No. 3, 1995, 945-948.
Rocca, et al., "Discharge-Pumped Soft-X-Ray Laser in Neon-Like Argon", Phys. Plasma, vol. 2, No. 6, 1995, 2547-2554.
Rocca, et al., "Fast Discharge Excitation of Hot Capillary Plasmas for Soft-X-Ray Amplifiers", Physical Review E, vol. 47, No. 2, 1993, 1299-1304.
Saini-Eidukat, et al., "Liberation of Fossils Using High Voltage Electric Pulses", Curator, vol. 39, 1996, 139-144.
Saprykin, et al., "Deformation of a spherical shell under internal loading by a shock generated by an underwater electrical discharge", Sov Appl Mech, Oct. 1988, 392-396.
Timoshkin, et al., "Plasma Channel Microhole Drilling Technology", Applied Electrical Technologies Group, Institute for Energy and Environment Department of Electronic & Electrical Engineering, University of Strathclyde, Abstract No. 10774, Jun. 2003, 1336-1339.
Timoshkin, et al., "Plasma Channel Miniature Hole Drilling Technology", IEEE Transactions on Plasma Science, vol. 32, No. 5, Oct. 2004, 2055-2061.

(56) References Cited

OTHER PUBLICATIONS

Vovchenko, et al., "Underwater pulse discharge (UPD) and its technological applications", Proc 3 Int Conf Prop Appl Dielectr Mater. Publ by IEEE, 1991, 1254-1257.
Ward, et al., "Identification of frictional ignition potential for rocks in Australian coal mines", Safety in Mines: the Role of Geology, 1997, 169-175.
Weise, et al., "Experimental investigations on rock fractioning by replacing explosives with electrically generated pressure pulses", IEEE International Pulsed Power Conference—Digest of Technical papers v 1, 1993, 19-22.
Yan, et al., "A 10 kW high-voltage pulse generator for corona plasma generation", Rev. Sci. Instrum. 72, 2001, 2443.
Yokawa, et al., "Pulse energization system applied for fluidized bed combustors", Sumitomo Jukikai Giho, Apr. 20, 1993, 85-89.
Ziemer, et al., "Performance Characterization of a High Efficiency Gas-Fed Pulsed Plasma Thruster", 33rd Joint Propulsion Conference, Seattle, Washing, Jul. 1997, 1-12.
Ziemer, et al., "Performance Scaling of Gas-Fed Pulsed Plasma Thrusters", A Dissertation presented to the Faculty of Princeton University, Jun. 2001, 1-232.
Zorin, et al., "Breaking of Coal", Institute of Geotechnical Mechanics, 1989, 242-244.

\* cited by examiner

METHOD AND APPARATUS FOR ISOLATING AND SWITCHING LOWER VOLTAGE PULSES FROM HIGH VOLTAGE PULSES IN ELECTROCRUSHING AND ELECTROHYDRAULIC DRILLS

CROSS-REFERENCE TO RELATED APPLICATIONS

This application claims priority to and the benefit of the filing of U.S. Provisional Patent Application Ser. No. 61/881,127, entitled "Isolation of High-Voltage Pulses from Lower-Voltage Switches in Electrocrushing Drills Via Use of Magnetic Diodes," filed on Sep. 3, 2013; U.S. Provisional Patent Application Ser. No. 61/900,695, entitled "Triggering of High-Current Switches in Electrocrushing Drills via use of Magnetic Switches," filed on Nov. 6, 2013; and U.S. Provisional Patent Application Ser. No. 61/904,268, entitled "A Transformer Magnetic Switch for Isolating and Switching Lower-Voltage Pulses from High Voltage Pulses in Electrocrushing Drills," filed on Nov. 14, 2013, and the specifications and claims of those applications are incorporated herein by reference.

BACKGROUND OF THE INVENTION

Field of the Invention (Technical Field)

The field of the present invention is the supply of high voltage pulses to a drill bit in an electro-crushing or electrohydraulic drill.

SUMMARY OF THE INVENTION (DISCLOSURE OF THE INVENTION)

The present invention is a method of providing a high voltage pulse to an electrocrushing or electrohydraulic drill bit, the method comprising providing a transformer comprising a core comprising a saturating high relative permeability magnetic material, the transformer delivering a high voltage pulse to an electrocrushing or electrohydraulic drill bit to initiate arc formation in a substrate being drilled, isolating lower voltage electrical components from the high voltage pulse, saturating the transformer core, thereby lowering its relative permeability, and the lower voltage components delivering a lower voltage current through the transformer and to the electrocrushing or electrohydraulic drill bit for maintaining the arc in the substrate. The method preferably further comprises substantially matching an impedance of the arc both during and after arc formation. A pulse width of the high voltage pulse is preferably shorter than a saturation time of the transformer core. The method preferably further comprises actively resetting the transformer by bringing the magnetic material out of saturation. The magnetic material preferably comprises Metglas, Supermendur, or a ferrite. The lower voltage components preferably comprise at least one switch and at least one capacitor and preferably comprise sufficient capacitance to absorb current that leaks through the transformer while the high voltage pulse is being delivered. The method oprionally further comprises flowing a second current to a capacitor while the transformer delivers the high voltage pulse, integrating the second current over a desired time until a threshold charge level is reached, thereby initiating the saturating step, inverting the polarity of the capacitor, and initiating delivery of the lower voltage current. A saturation time of the transformer core is preferably the time delay between initiation of delivering the high voltage pulse and initiation of delivering the lower voltage current. The capacitor is preferably electrically connected in parallel to the transformer.

The present invention is also an apparatus for switching power for use in electrocrushing or electrohydraulic drilling, the apparatus comprising a transformer comprising a core, the core comprising a saturating high relative permeability magnetic material, a first circuit electrically connected to the transformer, the first circuit for delivering high voltage pulses to an electrocrushing or electrohydraulic drill bit, and a second circuit electrically connected to the transformer, the second circuit for delivering a lower voltage current to the drill bit. The apparatus preferably further comprises a reset circuit for resetting the transform by bringing the magnetic material out of saturation. The magnetic material preferably comprises Metglas, Supermendur, or ferrites. The second circuit preferably comprises at least one switch and and least one capacitor and preferably comprises sufficient capacitance to absorb current that leaks through the transformer while the high voltage pulse is being delivered. The apparatus preferably further comprises a capacitor for triggering the second circuit. The capacitor is preferably electrically connected in parallel to the transformer.

Objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating certain embodiments of the invention and are not to be construed as limiting the invention. In the drawings.

DETAILED DESCRIPTION OF EMBODIMENTS OF THE INVENTION

Figure 1:
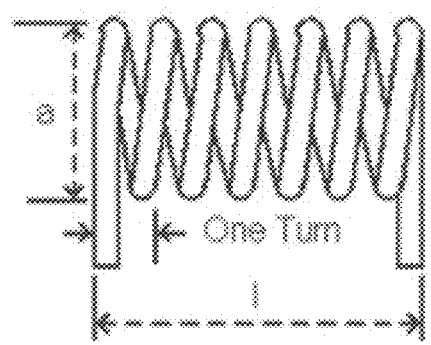
FIG. 1 is a diagram of solenoid-configuration linear inductor in accordance with an embodiment of the present invention.

"Electrocrushing" is defined herein as the process of passing a pulsed electrical current through a mineral substrate so that the substrate is "crushed" or "broken". One of the characteristics of the electro-crushing drilling process is very large disparity between the impedance of the bit before the arc is formed compared to the bit impedance after arc formation. The impedance of the arc during formation can be between approximately 150 and 500 ohms or even greater. The impedance of the arc after arc formation can be less than 10 ohms, and even lower with an electro-hydraulic system. If a single pulsed power system is used for the electro-crushing or electro-hydraulic system, then it will be significantly mismatched either during the arc formation stage or during the arc power loading stage. This mismatch creates a substantial reduction in efficiency. A spiker sustainer circuit (as disclosed in, for example, commonly owned U.S. Pat. No. 8,186,454, entitled "Apparatus and Method for Electrocrushing Rock") was adapted to the electro-crushing technology as a very important invention to resolve this issue. With the spiker sustainer technology two separate circuits are used to manage power flow into the arc. The spiker circuit provides the high impedance high voltage pulse necessary to initiate arc formation inside the rock. As used throughout the specification and claims, the term "high voltage" means greater than approximately 30 kV. The sustainer circuit then provides a tow impedance high current pulse necessary to break the rock.

One of the issues in developing practical electro-crushing drills is isolating the high voltage spiker pulse needed to initiate conduction inside the rock from lower voltage sustainer components in the system. As used throughout the specification and claims, the term "lower voltage" means less than approximately 30 kV. However, those lower voltage components, such as a switch, need to conduct current into the arc after the high voltage pulse has initiated conduction. One tool for isolating the high voltage pulse from lower voltage components is a saturating inductor, also known as a magnetic switch. When the magnetic switch is in the high inductance state, that inductance blocks the high voltage pulse from the lower voltage components. The time scale for current to flow through the magnetic switch in the high inductance state is longer than the width of the high voltage pulse.

$$V = L \, dI/dt$$

where V=the voltage of the pulse
L=the inductance of the magnetic switch
I=the current flowing through the magnetic switch
dI/dt=the rate of change of current through the magnetic switch with time.

Sufficient capacitance is incorporated into the lower voltage components to absorb the small amount of current that flows through the magnetic switch when in the high inductance state. The voltage pulse time scale is shorter than the time it takes sufficient current to flow through the magnetic switch to raise the voltage of the lower voltage capacitance above the design point.

Figure 2A:
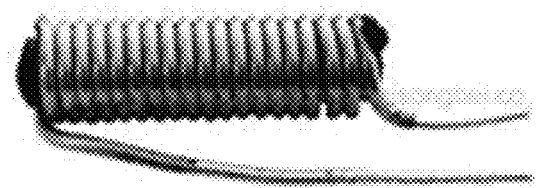
FIG. 2A is a diagram of a linear magnetic switch in accordance with an embodiment of the present invention.

To explain the saturation process of the present invention, consider a magnetic switch comprising coils of wire wound around cores of magnetic material to form a solenoid-configured inductor, as shown in FIG. 1, which shows the turns of wire, the connecting leads, and the space in the center to accommodate a high permeability core. FIG. 2A shows such a linear inductor with the core in place. The inductance of the linear magnetic switch is given by:

$$L = \mu_o \mu n^2 l A$$

where $\mu_o$=permeability of free space=$8.85 \times 10^{-12}$ farads/meter,
$\mu$=relative permeability (vacuum=1),
n=number of turns per meter,
l=length of the coil in meters, and
A=cross section area of the coil in square meters.

Figure 2B:
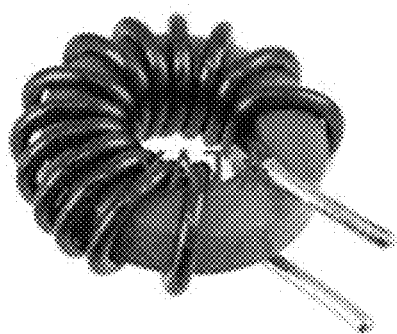
FIG. 2B is a diagram of a toroidal magnetic switch in accordance with an embodiment of the present invention.

When the current flowing in the inductor creates sufficient voltage over a specific period of time (i.e. the voltage-time (v-t) product), the magnetic material goes from a high relative permeability (defined as approximately 2000-10,000) to nearly approximately 1.0 (i.e. saturation), thus significantly reducing the inductance of the magnetic switch and facilitating separation of the high voltage input lead from the output lead. The time for the magnetic switch to saturate is preferably longer than the pulse width of the high voltage pulse, thus isolating the lower voltage components from the high voltage pulse. In addition, the current required to saturate the switch preferably does not flow until the arc connection through the rock has been made, except for some small current flow from stray capacitance plus leakage current from when L is high. Then, as the lower voltage component current flows through the magnetic switch, it saturates and becomes a low inductance low impedance conduit for the lower voltage component to feed power into the arc. In some embodiments of the present invention the saturating magnetic switch is incorporated into the transformer that provides the high voltage pulse. In these embodiments the transformer preferably comprises a saturating magnetic material such that after the transformer has delivered the high voltage pulse, the transformer core saturates, enabling lower voltage components to feed current into the arc. The high permeability of the core prior to saturation provides the inductive isolation of the high voltage pulse from the lower voltage components. An alternate embodiment is the toroidal configuration as shown in FIG. 2B, comprising a wire wrapped around a toroid comprising a high permeability saturable magnetic material.

Figure 3:
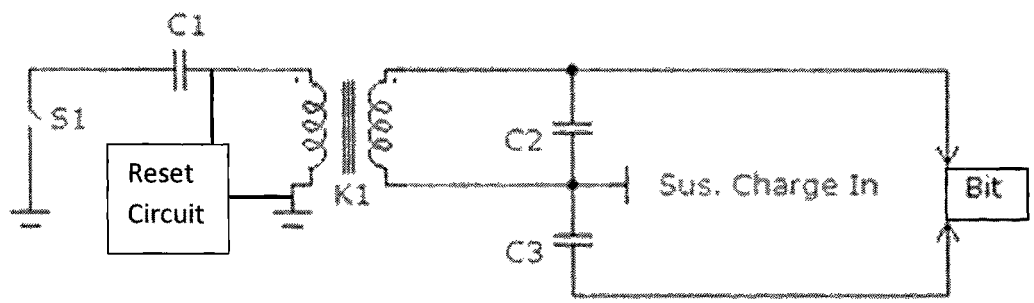
FIG. 3 is an example electrocrushing saturating transformer circuit diagram in accordance with an embodiment of the present invention.
Figure 4:
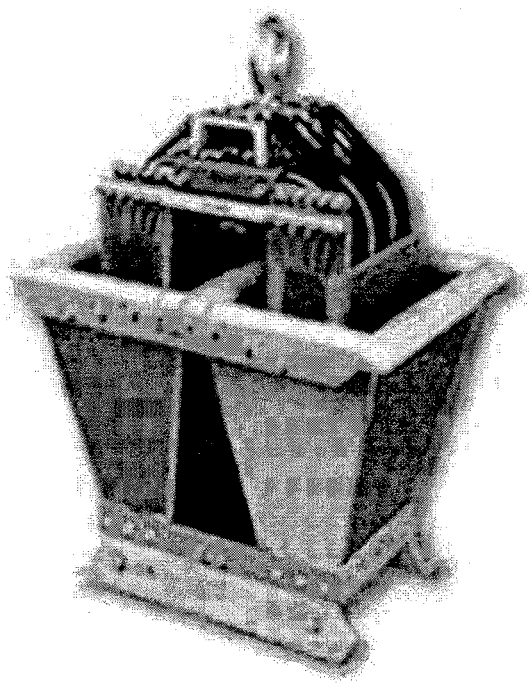
FIG. 4 is a picture of a high voltage pulse transformer in accordance with an embodiment of the present invention.

FIG. 3 shows an example circuit comprising transformer windings around the core K1 to provide the high voltage pulse and output windings to provide inductive isolation for the lower voltage components. When switch S1 closes, current flows from lower voltage capacitor C1 through the primary winding of the transformer, creating a high voltage pulse on capacitor C2, which is in turn connected to the bit in series with capacitor C3. As current flows through the bit from the establishment of the arc in the rock from the high voltage pulse, current flows from lower voltage capacitor C3 through the secondary windings of the transformer. The voltage-time product created by the flow of current from capacitor C3 through the bit and through the transformer saturates the transformer and hence provides the high current pulse to break the rock. FIG. 4 shows an embodiment of a typical high voltage pulse transformer, showing the black primary (lower voltage) windings and the secondary (high voltage) windings tapered for high voltage insulation and isolation. The core preferably comprises magnetic materials that have the desired saturation properties. This transformer is intended to be immersed in transformer oil for insulation. After the pulse is over, a reset circuit is often used to bring the transformer out of saturation and prepare it for the next pulse. Thus, a saturating transformer in accordance with the present invention enables the use of a high impedance high voltage spiker circuit to initially create conduction in the rock in conjunction with a lower voltage high current sustainer source to provide power into the arc to break the rock. The same piece of equipment, the saturating transformer, preferably provides both functions.

The core of magnetic material preferably comprises the capability of moving from high permeability to low permeability with the correct application of the voltage-time product in order for the transformer to possess the desired saturation properties. Magnetic materials suitable for the saturating transformer switch include ferrites, Metglas, Supermendur, and other similar magnetic materials with magnetic characteristics that facilitate saturation with the application of the correct voltage-time product.

Embodiments of the transformer magnetic switch of the present invention combine the functions of a pulse transformer and a high-voltage high current switch or diode that isolates the lower voltage components from the high voltage pulse. The transformer magnetic switch replaces the high voltage solid state diode or switch or gas switches that would be used to isolate the lower voltage components from the high voltage pulse and control the flow of current from the sustainer capacitor bank into the arc after arc formation. The switches require isolation from the high voltage pulse, said isolation is provided by the inductance of the secondary windings of the magnetic transformer switch. This is advantageous in the electro-crushing drill pulsed power circuit because such a switch is highly immune to damage from a fault in the circuit. For example, rock is very non-uniform, and the pulses delivered by the pulsed power system vary greatly from shot to shot during the drilling process. Occasionally a shot will produce very unusual current or voltage waveforms. If solid-state diodes were used for voltage isolation, they might be damaged by the unusual shot. A magnetic switch which functions as a diode, however, is very immune to damage from unusual events. In addition, the magnetic "diode" can be quite compact compared to high voltage solid-state diodes and their protection circuits.

Triggering

One of the difficulties with the spiker-sustainer circuit is electrical noise generated in the circuit from the spiker pulse. This electrical noise is often sufficient to trigger the sustainer switch, thus preventing proper control of the sustainer switch timing by the control system. In addition, the electrical noise is sometimes sufficient to damage the solid state trigger switches often used. Thus it is desirable to provide a noise immune trigger for turning on the sustainer switch in such a spiker-sustainer circuit without upsetting timing from electrical noise and without damage from electrical noise. An embodiment of such a trigger of the present invention is preferably configured for use with a saturating inductor, also known as a magnetic switch, as the switching element to trigger the sustainer switch. In embodiments of this invention, the saturating inductor (magnetic switch) is connected to the spiker output and conducts a small amount of current from the spiker output pulse through the magnetic switch to a ballast capacitor during the spiker pulse. This current flow, integrated over the desired time delay for sustainer ignition, will cause the magnetic switch to saturate creating a trigger pulse to turn on the sustainer switch.

The time for the magnetic switch to saturate is preferably designed to be the correct time delay between onset of the high voltage pulse and turning on the sustainer switch. After the trigger pulse is over, a reset circuit is often used to bring the magnetic switch out of saturation and prepare it for the next pulse. Thus, a magnetic switch in accordance with the present invention provides a trigger pulse to turn on the sustainer switch without susceptibility to electrical noise, either in timing upset or damage to components. The timing of the sustainer trigger pulse is preferably determined by passive components, and is not subject to upset from electrical noise. Once the timing of the sustainer trigger pulse has been set by the design of the magnetic switch, it will always be the same for a given spiker output voltage pulse profile.

Figure 5:
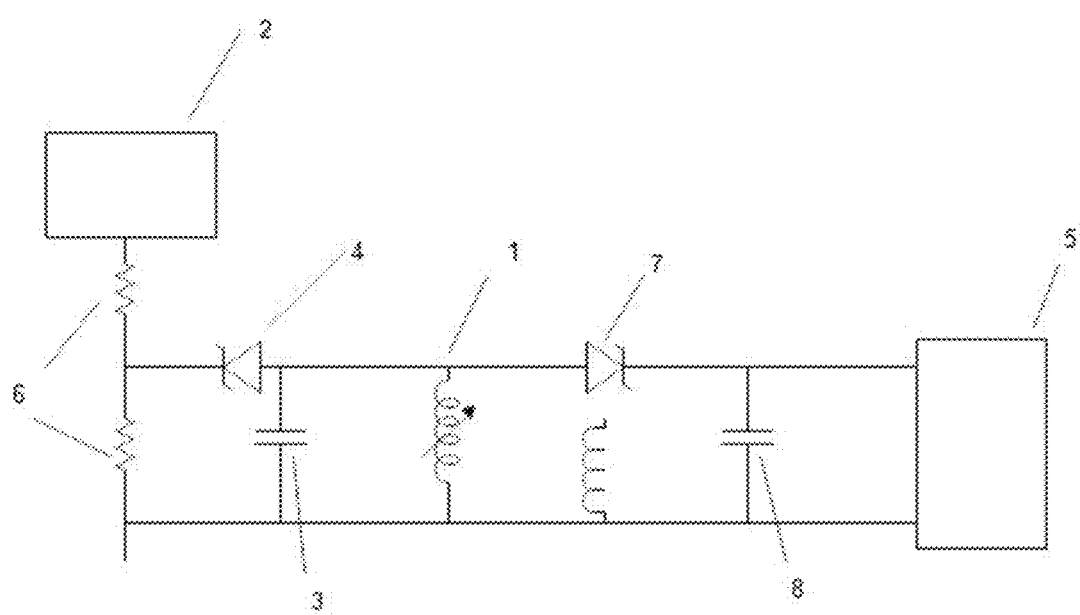
FIG. 5 is an embodiment of a schematic of a magnetic switch trigger for an electro-crushing drill switch.

FIG. 5 is a schematic of an embodiment of a magnetic switch trigger for an electro-crushing drill switch. Negative voltage signal 2, preferably the spiker output voltage of the pulse sent to the rock during the drilling process, is preferably reduced in magnitude through resistor array 6 and charges capacitor 3 through diode 4 in parallel with magnetic switch 1. When magnetic switch 1 saturates, it inverts the polarity of capacitor 3 to provide the required positive polarity to trigger (i.e. turn on) switch 5 through diode 7. Capacitor 8 is preferably used to manage the pulse shape going to switch 5.

Although the invention has been described in detail with particular reference to the disclosed embodiments, other embodiments can achieve the same results. Variations and modifications of the present invention will be obvious to those skilled in the art and it is intended to cover all such modifications and equivalents. The entire disclosures of all patents and publications cited above are hereby incorporated by reference.

What is claimed is:

1. A method of providing a high voltage pulse to an electrocrushing or electrohydraulic drill bit, the method comprising:
   providing a transformer comprising a core comprising a saturating high relative permeability magnetic material;
   the transformer delivering a high voltage pulse to an electrocrushing or electrohydraulic drill bit to initiate arc formation in a substrate being drilled;
   isolating lower voltage electrical components from the high voltage pulse;
   saturating the transformer core, thereby lowering its relative permeability; and
   the lower voltage components delivering a lower voltage high current pulse through the transformer and to the electrocrushing or electrohydraulic drill bit for powering the arc in the substrate and saturating the transformer core.

2. The method of claim 1 further comprising substantially matching an impedance of the arc both during and after arc formation.

3. The method of claim 1 wherein a pulse width of the high voltage pulse is shorter than a saturation time of the transformer core, thus preventing transformer core saturation by the high-voltage pulse.

4. The method of claim 1 further comprising actively resetting the transformer by bringing the magnetic material out of saturation.

5. The method of claim 1 wherein the magnetic material comprises an amorphous metal alloy, a cobalt-iron alloy, or a ferrite.

6. The method of claim 1 wherein the lower voltage components comprise at least one switch and at least one capacitor.

7. The method of claim 1 wherein the lower voltage electrical components comprise sufficient capacitance to absorb current that leaks through the transformer while the high voltage pulse is being delivered.

8. The method of claim 1 wherein a saturation time of the transformer core is the time delay between initiation of delivering the high voltage pulse and initiation of delivering the lower voltage current.

9. The method of claim 6 wherein said at least one switch comprises a solid state switch, a solid state diode switch, a gas switch, or a magnetic switch.

10. An apparatus for switching power for use in electrocrushing or electrohydraulic drilling, the apparatus comprising:
   a transformer comprising a core and separate primary and secondary windings, said core comprising a saturating high relative permeability magnetic material;

a first circuit electrically connected to said primary winding, said first circuit for delivering an electrical pulse to said primary winding;

a second circuit electrically connected to said secondary winding, said second circuit comprising a first capacitor connected in parallel to said secondary winding, wherein a first end of said first capacitor and a first end of said secondary winding is electrically connected to an electrocrushing or electrohydraulic drill bit; and a second capacitor, wherein a first end of said second capacitor is electrically connected to a second end of said first capacitor and a second end of said secondary winding, and a second end of said second capacitor is electrically connected to said electrocrushinq or electrohydraulic drill bit;

wherein said second capacitor is charged at a voltage lower than a voltage charging said first capacitor.

11. The apparatus of claim 10 further comprising a reset circuit for resetting said transform by bringing said magnetic material out of saturation.

12. The apparatus of claim 10 wherein said magnetic material comprises an amorphous metal alloy, a cobalt-iron alloy, or a ferrite.

13. The apparatus of claim 10 wherein said first circuit comprises at least one switch and at least one capacitor.

14. The apparatus of claim 10 wherein said second circuit comprises sufficient capacitance to absorb current that leaks through said transformer while a high voltage pulse is being delivered to said electrocrushing or electrohydraulic drill bit.

15. The apparatus of claim 13 wherein said at least one switch comprises a solid state switch, a solid state diode switch, a gas switch, or a magnetic switch.

* * * * *